United States Patent
Hsieh et al.

(10) Patent No.: US 9,679,619 B2
(45) Date of Patent: Jun. 13, 2017

(54) SENSE AMPLIFIER WITH CURRENT REGULATING CIRCUIT

(71) Applicant: TAIWAN SEMICONDUCTOR MANUFACTURING COMPANY, LTD., Hsinchu (TW)

(72) Inventors: Chi-Kai Hsieh, Yangmei (TW); Hong-Chen Cheng, Hsinchu (TW); Cheng Hung Lee, Hsinchu (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/214,325

(22) Filed: Mar. 14, 2014

(65) Prior Publication Data

US 2014/0269128 A1 Sep. 18, 2014

Related U.S. Application Data

(60) Provisional application No. 61/798,932, filed on Mar. 15, 2013.

(51) Int. Cl.
*G11C 7/06* (2006.01)
*G11C 7/08* (2006.01)
*G11C 7/10* (2006.01)

(52) U.S. Cl.
CPC ............... *G11C 7/065* (2013.01); *G11C 7/08* (2013.01); *G11C 7/1048* (2013.01)

(58) Field of Classification Search
CPC .......... G11C 7/065; G11C 7/08; G11C 7/1048
USPC .................................................. 365/203, 205
See application file for complete search history.

(56) References Cited

U.S. PATENT DOCUMENTS

| | | | | |
|---|---|---|---|---|
| 4,701,644 A | * | 10/1987 | Campione | G11C 7/062 327/208 |
| 4,845,675 A | * | 7/1989 | Krenik | G11C 7/1051 327/57 |
| 5,036,231 A | * | 7/1991 | Kanbara | G11C 7/1087 327/55 |
| 5,604,705 A | * | 2/1997 | Ackland | G11C 11/419 365/190 |

(Continued)

*Primary Examiner* — Vu Le
*Assistant Examiner* — Sung Cho
(74) *Attorney, Agent, or Firm* — Hauptman Ham, LLP

(57) ABSTRACT

A sense amplifier includes a cross latch, a first pass gate, a second pass gate, a first data line, a second data line, a first circuit, and a second circuit. The cross latch has a first input/output (I/O) node and a second I/O node. The first pass gate is coupled between the first data line and the first I/O node. The second pass gate is coupled between the second data line and the second I/O node. The first circuit is coupled with the first I/O node and the second data line. The second circuit is coupled with the second I/O node and the first data line. The first circuit is configured to be turned off when the second data line has a first logical value and to be at least lightly turned on when the second data line has a voltage level between the first logical value and a second logical value different from the first logical value. The second circuit is configured to be turned off when the first data line has the first logical value and to be at least lightly turned on when the first data line has a voltage level between the first logical value and the second logical value.

20 Claims, 5 Drawing Sheets

(56) References Cited

U.S. PATENT DOCUMENTS

| | | | | |
|---|---|---|---|---|
| 5,808,487 A * | 9/1998 | Roy | G11C 7/1006 | 327/55 |
| 5,883,846 A * | 3/1999 | Lee | G11C 7/065 | 365/189.05 |
| 5,936,904 A * | 8/1999 | El Hajji | G11C 7/065 | 365/154 |
| 6,134,164 A * | 10/2000 | Lattimore | G11C 7/065 | 365/190 |
| 6,301,179 B1 * | 10/2001 | Lawson | G11C 7/067 | 365/203 |
| 6,351,155 B1 * | 2/2002 | Pogrebnoy | G11C 7/12 | 327/51 |
| 6,411,559 B1 * | 6/2002 | Yokozeki | G11C 7/065 | 327/55 |
| 6,687,175 B1 * | 2/2004 | Mizuno | G11C 7/04 | 365/203 |
| 6,847,569 B2 * | 1/2005 | Sinha | G11C 7/062 | 365/188 |
| 7,257,042 B2 * | 8/2007 | Reohr | G11C 7/02 | 365/205 |
| 7,263,016 B1 * | 8/2007 | Palumbo | G11C 7/065 | 327/57 |
| 7,298,180 B2 * | 11/2007 | Hung | G11C 7/065 | 327/52 |
| 2008/0239849 A1 * | 10/2008 | Do | G11C 7/08 | 365/205 |
| 2010/0165767 A1 * | 7/2010 | Lin | G11C 11/412 | 365/203 |
| 2011/0199847 A1 * | 8/2011 | Chen | G11C 7/065 | 365/205 |
| 2012/0063252 A1 * | 3/2012 | Sharma | G11C 7/06 | 365/207 |
| 2012/0140575 A1 * | 6/2012 | Pham | G11C 7/04 | 365/189.07 |
| 2014/0003160 A1 * | 1/2014 | Trivedi | G11C 7/12 | 365/189.02 |
| 2014/0140144 A1 * | 5/2014 | Nakazato | G11C 7/06 | 365/189.02 |

* cited by examiner

US 9,679,619 B2

SENSE AMPLIFIER WITH CURRENT REGULATING CIRCUIT

PRIORITY CLAIM AND CROSS-REFERENCE

The present application claims priority of U.S. Provisional Patent Application No. 61/798,932, filed on Mar. 15, 2013, the disclosure of which is incorporated herein by reference in its entirety.

FIELD

The present disclosure is related to a sense amplifier.

BACKGROUND

Performance of a sense amplifier depends on manufacturing processes to manufacture transistors in the amplifier. For example, two transistors manufactured by a same process are supposed to have the same characteristics and/or behave in a same manner. Because of manufacturing process variations, however, characteristics and behaviors of the two transistors are not the same. Explained in a different way, a mismatch between the two transistors exists.

For illustration, the sense amplifier is used to sense a voltage difference on two data lines of a memory cell. The voltage difference is also called a data split. In a read operation of the memory cell, initially, the data split is smaller than a sensing threshold of the sense amplifier. As a result, the sense amplifier cannot sense the data, but has to wait for the data split to develop and becomes larger than the sensing threshold. Because of mismatches of transistors in the sense amplifier, the wait time increases. Consequently, a sensing speed of the sense amplifier decreases.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
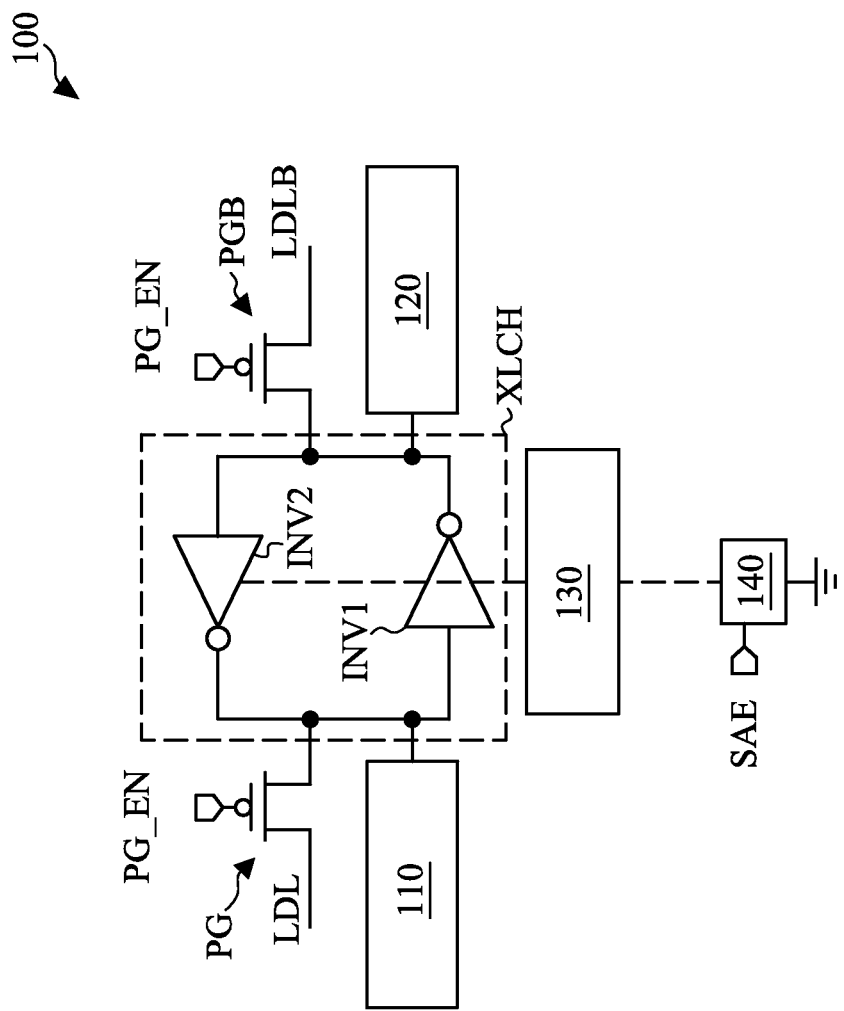
FIG. 1 is a diagram of a sense amplifier, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments, a sense amplifier includes circuits to regulate currents in different branches of a sense amplifier. As a result, mismatches of transistors in the sense amplifier are compensated. Consequently, a sensing threshold decreases, a sensing time decreases, and a sensing speed increases, compared with a sense amplifier without the current regulating circuits.

Sense Amplifier

FIG. 1 is a diagram of a sense amplifier 100, in accordance with some embodiments. Sense amplifier 100 includes a cross-latch XLCH, pass gates PG and PGB, and circuits 110, 120, 130, and 140. Pass gates PG and PGB are also called pass gate transistors PG and PGB, respectively. Cross-latch XLCH includes inverters INV1 and INV2. Circuits 110, 120, 130 are configured to reduce current drawn by sense amplifier 100 when sense amplifier 100 is activated to sense data DL and DLB (not shown) passed along lines LDL and LDLB. Activation circuit 140 is configured to activate sense amplifier 100 responsive to a sense amplifier enabling signal SAE. Operations of sense amplifier 100 are described with reference to FIG. 2.

Figure 2:
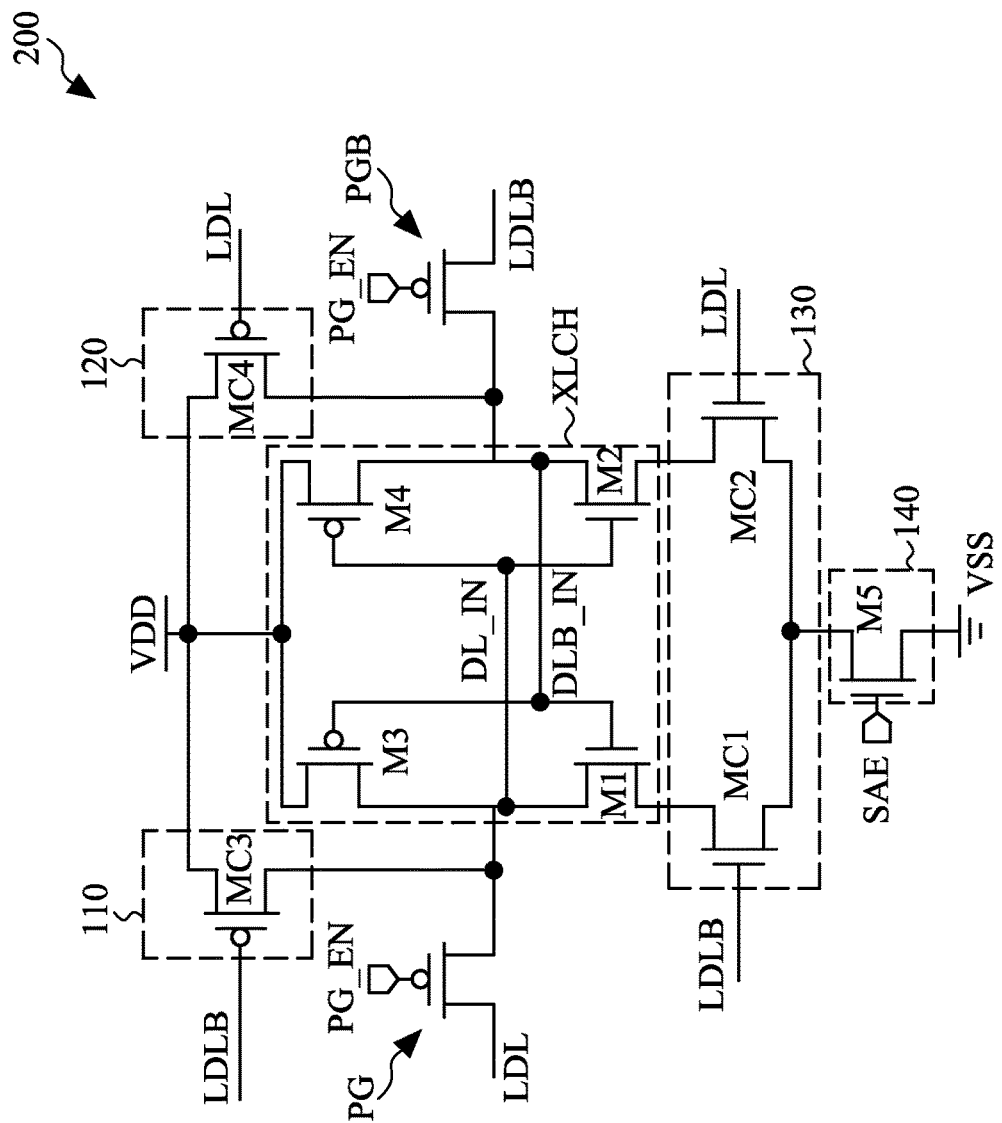
FIG. 2 is a circuit diagram of a sense amplifier, in accordance with some embodiments.

FIG. 2 is a circuit diagram of a sense amplifier 200, in accordance with some embodiments. Sense amplifier 200 is an example implementation of sense amplifier 100 in FIG. 1. Like reference numbers are used in FIGS. 1 and 2 to refer to corresponding components thereof.

Pass gate transistor PG transfers data DL on line LDL at a source of transistor PG to a node DL_IN based on a control signal PG_EN at a gate of transistor PG. For example, when signal PG_EN is logically high, transistor PG is turned off. As a result, line LDL is electrically disconnected from node DL_IN. But when signal PG_EN is logically low, transistor PG is turned on, and line LDL is electrically coupled to node DL_IN. Effectively, data DL on line LDL is transferred to node DL_IN. Pass gate transistor PGB transfers data DLB on line LDLB to node DLB_IN in a manner similar to pass gate transistor PG transferring data DL to node DL_IN.

Transistors M1, M2, M3, and M4 form the cross-coupled pair of inverters or the cross-latch XLCH in FIG. 1. For example, transistors M1 and M3 form inverter INV2 while transistors M2 and M4 form inverter INV1 shown in FIG. 1. PMOS transistor MC3 forms circuit 110 in FIG. 1 while PMOS transistor MC4 forms circuit 120. A gate of transistor MC3 is coupled to line LDLB. Effectively, the gate of transistor MC3 and the source of pass gate transistor PGB receive the same data DLB on line LDLB. In contrast, the gate of transistors MC4 is coupled to line LDL and receives data DL. Effectively, the gate of transistor MC4 and the source of pass gate transistor PG receive the same data DL on line LDL.

NMOS transistors MC1 and MC2 form circuit 130 in FIG. 1. A gate of transistor MC1 is coupled to line LDLB. Effectively, the gates of transistors MC1, MC3, and the source of pass gate transistor PGB receive the same data DLB on line LDLB. In contrast, a gate of transistor MC2 is coupled to line LDL. Effectively, the gates of transistors MC2, MC4, and the source of pass gate transistor PG receive the same data DL on line LDL.

NMOS transistor M5 forms circuit 140 in FIG. 1. Signal SAE at a gate of transistor M5 is used to turn on or turn off transistor M5.

Memory Cell

Figure 3:
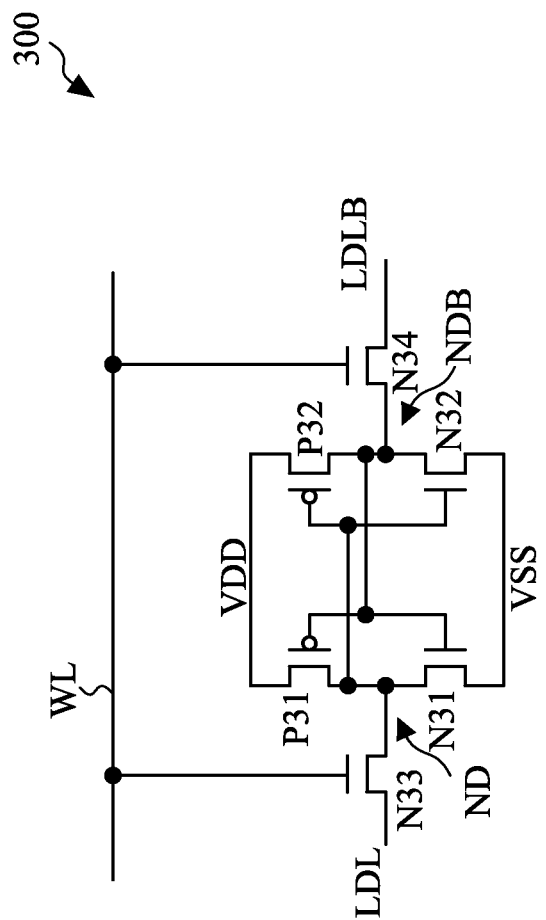
FIG. 3 is a diagram of a memory cell, in accordance with some embodiments.

FIG. 3 is a diagram of a memory cell 300, in accordance with some embodiments. In some embodiments, data stored in memory cell 300 is sensed by sense amplifier 100 or 200.

Memory cell 300 includes two P-type metal oxide semiconductor (PMOS) transistors P31 and P32, and four N-type metal oxide semiconductor (NMOS) transistors N31, N32, N33, and N34. Transistors P31, P32, N31, and N32 form a cross-coupled pair of inverters, which is also called a cross-latch. Transistors P31 and N31 form a first inverter. Transistors P32 and N32 form a second inverter. Drains of transistors P31 and N31 are coupled together and form a node ND. Drains of transistors P32 and N32 are coupled together and form a node NDB. Gates of transistors P31 and N31 are coupled together and with drains of transistors P32 and N32. Gates of transistors P32 and N32 are coupled together and with drains of transistors P31 and N31.

A word line WL is coupled with a gate of each of transistors N33 and N34. In a row of memory cells 300, word line WL is coupled with a gate of each of transistors N33 and N34 of a plurality of memory cells in the row of memory cells. Word line WL is also called a control line because the signal on word line WL turns on transistors N33 and N34 to transfer data DL and data DLB to corresponding nodes ND and NDB, or turns off transistors N33 and N34 to electrically isolate lines LDL and data LDLB from corresponding nodes ND and NDB.

Data line LDL couples each of data DL in a column of memory cell 300, and data line LDLB couples each of data DLB in the same column. Effectively, drains of each of transistors N33 and N34 in a column receive data DL and data DLB, respectively.

In a write operation of memory cell 300, in some embodiments, data lines LDL and LDLB are applied with logical values to be written to corresponding nodes ND and NDB. In other words, data DL and DLB having the logical values are applied to lines LD and LDLB, respectively. Word line WL is then activated to turn on transistors N33 and N34, which transfer data DL and data DLB on respective data lines LDL and LDLB to corresponding nodes ND and NDB.

In a read operation, data lines LDL and LDLB are pre-charged to a high logical value. Word line WL is then activated to turn on transistors N33 and N34. The data stored in nodes ND and NDB are therefore transferred to data lines LDL and LDLB. Based on a low logical value of the data stored in a corresponding node ND or node NBD, one data line LDL or LDLB is pulled towards a low logical value, and the other data line remains at the same pre-charged high logical value. In other words, a data line split between data lines LDL and LDLB develops. When the data line split is sufficiently large, such as a threshold of sense amplifier 200, sense amplifier 200 is turned on to sense the data line split and reveals the data stored in nodes ND and NDB.

For illustration, node ND stores a low logical value, and node NDB stores a high logical value. Because data line LDLB is logically high, node NDB via the then turned-on transistor N34 remains at the high logical value. Because node NDB is at a gate of NMOS transistor N31 and has a high logical value, NMOS transistor N31 is turned on. Because both transistors N33 and N31 are turned on, data line LDL is pulled towards reference voltage VSS or ground at the source of NMOS transistor N31. As data line LDLB stays at the same high logical value and data line LDL is pulled towards a low logical value, a data line split between data lines LDL and LDLB develops. When the data line split is sufficiently large, sense amplifier 200 is turned on to sense the data line split and recognizes data line LDL being pulled towards a low logical value. In other words, sense amplifier 200 recognizes that node ND stores a low logical value and node NDB therefore stores a high logical value.

When node ND stores a high logical value, node NDB stores a low logical value. Sensing node ND storing a high logical value is similar to sensing node NDB storing a low logical value. Operations to sense node NDB having a low logical value with reference to NMOS transistors N34, N32 and data line LDLB are similar to operations to sense node ND having a low logical value with reference to NMOS transistors N33, N31 and data line DL as explained above.

Waveforms

Figure 4:
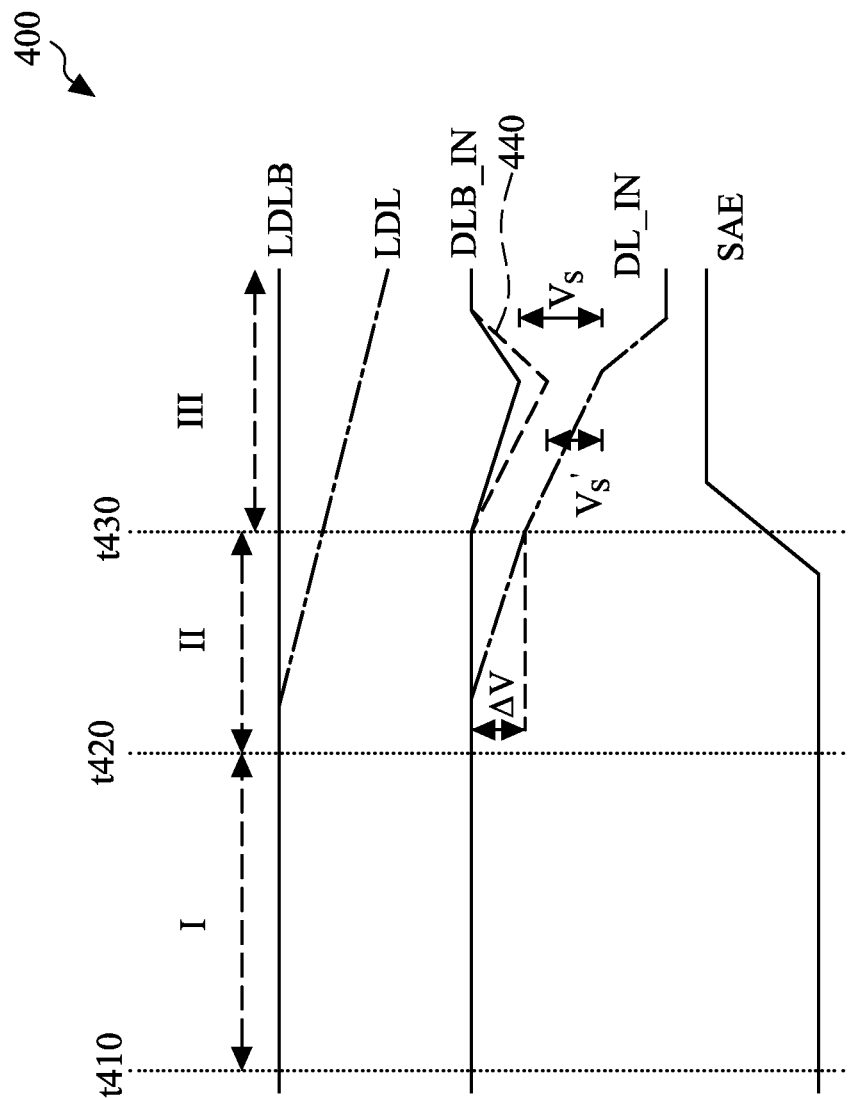
FIG. 4 is a graph of waveforms of operating a sense amplifier, in accordance with some embodiments.

FIG. 4 is a graph of waveforms 400, in accordance with some embodiments. Waveforms 400 include waveforms of signals in a read operation of memory cell 300. In this illustration, node ND and node NDB store a low and a high logical value, respectively.

At a time t410, data lines LDL and LDLB are pre-charged to a high logical value. Signal SAE is logically low. Transistor M5 and sense amplifier 200 are therefore off. Word line WL is logically low. Consequently, the data stored in nodes ND and NDB is contained within memory cell 300. Signal PG_EN is applied with a low logical value. As a result, transistors PG and PGB are turned on. Nodes DL_IN and DLB_IN are therefore pre-charged to a high logical value from the high logical value of data lines LDL and LDLB. Phase I between time t410 and a time t420 is referred to as a pre-charge phase.

At time t420, word line WL is activated with a high logical value. Data on nodes ND and NDB is therefore transferred to data lines LDL and LDLB and represent corresponding data DL and DLB. A data split between data lines LDL and LDLB starts to develop. Because pass gate transistors PG and PGB are turned on, the data split between data lines LDL and LDLB is reflected on corresponding data nodes DL_IN and DLB_IN. In other words, a data split between nodes DL_IN and DLB_IN also develops. Signal PG_EN is then de-activated with a high logical value. Nodes DL_IN and DLB_IN are therefore electrically disconnected from data lines LDL and LDLB. Phase II between time t420 and a time t430 is referred to as a develop phase.

At time t430, signal SAE is activated with a high logical value. As a result, transistor M5 is turned on and provides a current path for sense amplifier 200. In other words, sense amplifier 200 is turned on. Phase III after time t430 is referred to as an evaluate phase. In some embodiments, signal SAE is set to be activated after the data split between data lines LDL and LDLB is greater than a predetermined threshold value ΔV.

Because data DLB on line LDLB at a gate of transistor MC1 is logically high, transistor MC1 is turned on. Transistor MC1 together with transistor M1 pull node DL_IN at a drain of transistor M1 to a low logical value at the source of transistor M5. Explained in a different way, transistor MC1 provides additional current and helps transistor M1 to pull node DL_IN to a low logical value. As a result, node DL_IN is pulled to a low logical value faster than situations where transistor MC1 does not exist. In other words, the time for the data split between nodes DL_IN and DLB_IN to develop to the sensing threshold of sense amplifier 200 decreases. Sensing speed of sense amplifier 200 is therefore increases.

Because data DL on line LDL at the gate of transistor MC2 is pulled towards a low logical value, NMOS transistor MC4 conducts weaker. As the voltage value of data DL on line LDL decreases, NMOS transistor MC2 conducts weaker and weaker, and draws lesser and lesser current. Effectively, transistor MC2 functions to limit a flow of current IM2 that flows from transistor M2 through transistor MC2 and transistor M5 to ground at the source of transistor M5. Explained in a different way, transistor MC2 functions to weaken transistor M2.

Because data DL on line LDL at the gate of transistor MC4 is pulled towards a low logical value, PMOS transistor MC4 starts to conduct. As the voltage value of data DL decreases, PMOS transistor MC4 conducts stronger. As PMOS transistor MC4 conducts, PMOS transistor MC4 tends to pull node DLB_IN at a drain of transistor MC4 to voltage VDD at a source of transistor MC4. Effectively, transistor MC4 helps PMOS transistor M4 to keep node DLB_IN at the high logical value. In other words, transistor MC4 helps maintain the high logical value of node DLB_IN. Node DLB_IN is at the gate of transistor M1. As a result, as node DLB_IN stays at the high logical value, NMOS transistor MC1 remains to conduct strongly. For example, if the voltage value of node DLB_IN fluctuates to a low value of the high logical value, transistor M1 conducts weaker. Because transistor M1 remains to conduct strongly, node DL_IN is pulled to a low logical value at the source of transistor M5 faster.

In brief, transistor MC1 and transistor MC4 strengthen transistor M1, and transistor MC2 weakens transistor M2. As a result, if a mismatch exists between transistor M1 and transistor M2, such as when transistor M2 is stronger than transistor M1, transistors MC1 and MC4 reduce the mismatch between transistor M1 and M2.

Additionally, the voltage difference Vs between nodes DL_IN and BLB_IN according to some embodiments of the present disclosure is greater than the voltage difference Vs' between nodes DL_IN and DLB_IN in a configuration without circuits 110, 120, and/or 130, as represented by dotted line 440.

In some embodiments, compared with a configuration without circuits 110, 120, and/or 130, the timing for activating signal SAE is earlier, and thus sensing speed of sense amplifier 200 increases. In some embodiments, the chance of voltage levels at nodes DL_IN and DLB_IN crossing over each other is reduced, and the yield rate of mass production of sense amplifier 200 thus increases.

Method

Figure 5:
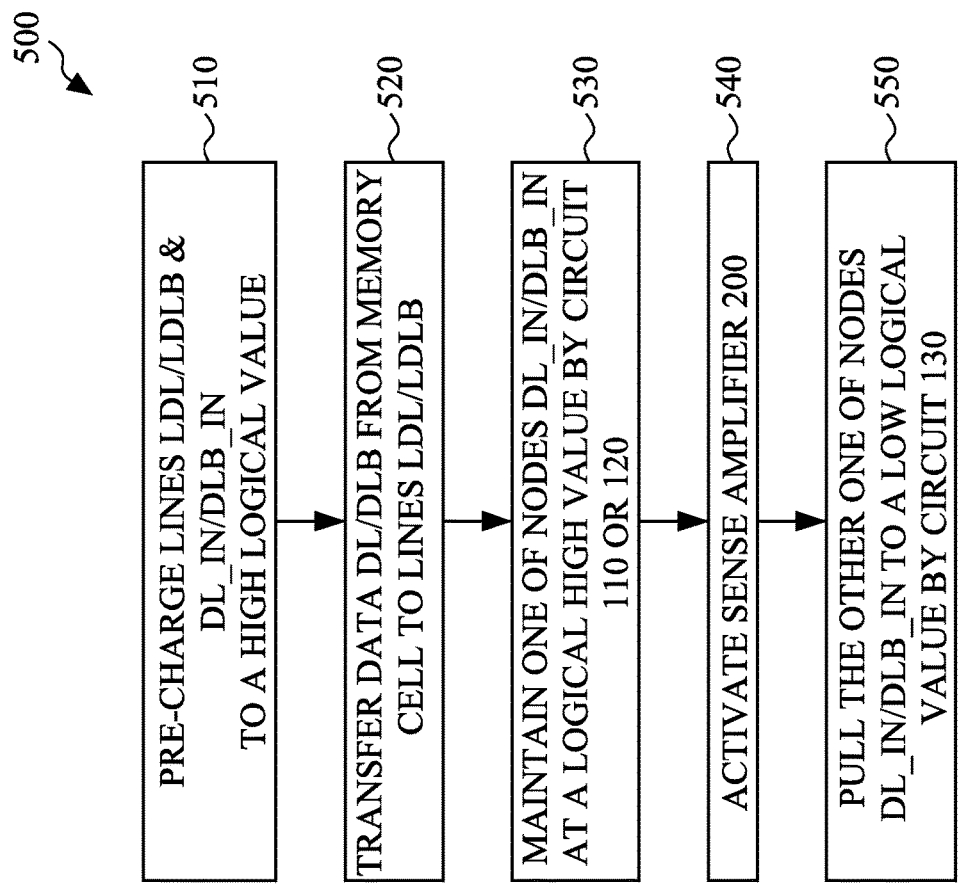
FIG. 5 is a flowchart of a method of operating a sense amplifier, in accordance with some embodiments.

FIG. 5 is a flowchart of a method 500 of operating a sense amplifier, in accordance with some embodiments. Method 500 is used for illustration. Additional operations may be performed before, during, and/or after method 500. Further, some operations may only be briefly described herein, and one or more operations in FIG. 5 are omitted.

Refer to FIG. 5 and FIG. 2, in operation 510, lines LDL and LDLB and nodes DL_IN and DLB_IN are pre-charged to a high logical value. In some embodiments, the high logical value is VDD or VDD-Vt, wherein Vt is a threshold voltage of a PMOS transistor. In some embodiments, control signal PG_EN is set to have a low logical value to turn on pass gates PG and PGB. In some embodiments, the low logical value is VSS or ground (i.e., 0 V). In some embodiments, signal SAE is set to have a low logical value to turn off sense amplifier 200. In some embodiments, operation 510 corresponds to the pre-charge phase I in FIG. 4.

In operation 520, in some embodiments, signal WL in FIG. 3 is set to have a high logical value to turn on transistors N33 and N34. Data DL and data DLB are therefore transferred from an accessed memory cell 300 to lines LDL and LDLB. As a result, a voltage level on one of lines LDL and LDLB is pulled toward the low logical value responsive to data DL and data DLB.

In operation 530, voltage levels on lines LDL and LDLB begin to slightly turn on one of circuits 110 and 120 in FIG. 2. The turned on one of circuits 110 and 120 maintains the voltage level on the corresponding one of the nodes DL_IN and DLB_IN at the logic high level. For illustration, transistor MC4 of circuit 120 is turned on. As a result, node DLB_IN is maintained at the logic high level.

In some embodiments, operations 520 and 530 correspond to the develop phase II in FIG. 4. In some embodiments, signal SAE remains at a low logical value during performance of operations 520 and 530. In some embodiments, control signal PG_EN remains to have a low logical value to turn on pass gates PG and PGB during performance of operations 520 and 530. In some embodiments, control signal PG_EN is set to a high logical value during performance of operations 520 and 530 to turn off pass gates PG and PGB.

In operation 540, signal SAE is activated to turn on sense amplifier 200 in FIG. 2. In some embodiments, signal PG_EN is also set to or remains at the high logical value to turn off pass gates PG and PGB. Because sense amplifier 200 is turned on, cross-latch XLCH pulls one of nodes DL_IN and DLB_IN to a high logical value and the other one of nodes DL_IN and DLB_IN to a low logical value. For illustration, node DLB_IN is pulled to the high logical value and node DL_IN is pulled to the low logical value.

In operation 550, voltage levels on lines LDL and LDLB turn on one of transistor M1 or M2 and partially or fully turn off the other one of transistor M1 or M2 responsive to voltage levels on lines LDL and LDLB. Thus, circuit 130 is capable of pulling the other one of the nodes DL_IN and DLB_IN toward the low logical level.

In some embodiments, a sense amplifier includes a cross latch, a first pass gate, a second pass gate, a first data line, a second data line, a first circuit, and a second circuit. The cross latch has a first input/output (I/O) node and a second I/O node. The first pass gate is coupled between the first data line and the first I/O node. The second pass gate is coupled between the second data line and the second I/O node. The first circuit is coupled with the first I/O node and the second data line. The first circuit is configured to be turned off when the second data line has a first logical value and to be at least lightly turned on when the second data line has a voltage level between the first logical value and a second logical value different from the first logical value. The second circuit is coupled with the second I/O node and the first data line. The second circuit is configured to be turned off when the first data line has the first logical value and to be at least lightly turned on when the first data line has a voltage level between the first logical value and the second logical value.

In some embodiments, the first circuit includes a transistor having a source coupled to a power node, a drain coupled to the first I/O node, and a gate coupled to the second data line. In some embodiments, the transistor is a P-type transistor.

In some embodiments, the second circuit includes a transistor having a source coupled to a power node, a drain coupled to the second I/O node, and a gate coupled to the first data line. In some embodiments, the transistor is a P-type transistor.

In some embodiments, the sense amplifier further includes a third circuit coupled with the cross latch. The third circuit is configured to reduce driving current at one of the first I/O node and the second I/O node responsive to voltage values on the first data line and the second data line.

In some embodiments, the sense amplifier further includes an activation circuit coupled between the third circuit and a power node, where the activation circuit is configured to electrically couple the third circuit and the cross latch with the power node. In some embodiments, the activation circuit includes a transistor having a source coupled to the power node, a drain coupled to the third circuit, and a gate configured to receive a control signal. In some embodiments, the transistor is an N-type transistor.

In some embodiments, the third circuit includes a first transistor and a second transistor. The first transistor has a source coupled to an intermediate node, a drain coupled to the first I/O node partially through the cross-latch, and a gate coupled to the second data line. The second transistor has a source coupled to the intermediate node, a drain coupled to the second I/O node partially through the cross-latch, and a gate coupled to the first data line. In some embodiments, the first transistor and the second transistor are N-type transistors.

In some embodiments, the activation circuit is coupled between the intermediate node and a power node.

In a method of some embodiments, a first pass gate coupling a first data line and a first node of a sense amplifier is turned on. A second pass gate coupling a second data line and a second node of the sense amplifier is turned on. The first data line, the second data line, the first node, and the second node a pre-charged to a first logical level. One of the first data line and the second data line, and a corresponding one of the first node and the second node, are pulled toward a second logic level different from the first logic level. The first pass gate and the second pass gate are turned-off. The sense amplifier is activated. Prior to the activating the sense amplifier, a first circuit is driven to maintain the other one of the first node and second node at the first logic value responsive to a voltage level of the one of the first data line and the second data line.

In some embodiments, in the method, a second circuit is driven to pull the one of the first node and second node toward the second logical value responsive to a voltage level of the other one of the first data line and the second data line. The second circuit is outside a cross latch of the sense amplifier.

In some embodiments, a sense amplifier comprises a cross latch, a first pass gate, a second pass gate, a first circuit, a second circuit, and a third circuit. The cross latch has a first input/output (I/O) node and a second I/O node. The first pass gate is coupled between a first data line and the first I/O node. The second pass gate is coupled between a second data line and the second I/O node. The first circuit is coupled with the first I/O node and the second data line. The second circuit is coupled with the second I/O node and the first data line. The third circuit is coupled with the cross latch, the first data line, and the second data line.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A sense amplifier comprising:
    a cross latch having a first input/output (I/O) node and a second I/O node;
    a first pass gate coupled between a first data line and the first I/O node;
    a second pass gate coupled between a second data line and the second I/O node;
    a first circuit coupled with the first I/O node and the second data line, and configured to be turned off when the second data line has a first logical value and to be at least lightly turned on by a transition of a voltage level on the second data line between the first logical value and a second logical value different from the first logical value; and
    a second circuit coupled with the second I/O node and the first data line, and configured to be turned off when the first data line has the first logical value and to be at least lightly turned on by a transition of a voltage level on the first data line between the first logical value and the second logical value, wherein
    the first pass gate is configured to be in a closed state during a pre-charge phase of the sense amplifier.

2. The sense amplifier of claim 1, wherein the first circuit comprises:
    a transistor having a source coupled to a power node, a drain coupled to the first I/O node, and a gate coupled to the second data line.

3. The sense amplifier of claim 2, wherein the transistor is a P-type transistor.

4. The sense amplifier of claim 1, wherein the second circuit comprises:
    a transistor having a source coupled to a power node, a drain coupled to the second I/O node, and a gate coupled to the first data line.

5. The sense amplifier of claim 4, wherein the transistor is a P-type transistor.

6. The sense amplifier of claim 1, further comprising:
    a third circuit coupled with the cross latch, and configured to reduce driving current at one of the first I/O node and the second I/O node responsive to voltage values on the first data line and the second data line.

7. The sense amplifier of claim 6, further comprising an activation circuit coupled between the third circuit and a power node, and configured to electrically couple the third circuit and the cross latch with the power node.

8. The sense amplifier of claim 7, wherein the activation circuit comprises:
    a transistor having a source coupled to the power node, a drain coupled to the third circuit, and a gate configured to receive a control signal.

9. The sense amplifier of claim 8, wherein the transistor is an N-type transistor.

10. The sense amplifier of claim 6, wherein the third circuit comprises:

a first transistor having a source coupled to an intermediate node, a drain coupled to the first I/O node partially through the cross-latch, and a gate coupled to the second data line; and
a second transistor having a source coupled to the intermediate node, a drain coupled to the second I/O node partially through the cross-latch, and a gate coupled to the first data line.

11. The sense amplifier of claim 10, wherein the first transistor and the second transistor are N-type transistors.

12. The sense amplifier of claim 10, further comprising an activation circuit coupled between the intermediate node and a power node.

13. The sense amplifier of claim 12, wherein the activation circuit comprises:
a third transistor having a source coupled to the power node, a drain coupled to the intermediate node, and a gate configured to receive a control signal.

14. The sense amplifier of claim 13, wherein the third transistor is an N-type transistor.

15. A method comprising:
turning on a first pass gate coupling a first data line and a first node of a sense amplifier;
turning on a second pass gate coupling a second data line and a second node of the sense amplifier;
pre-charging the first data line, the second data line, the first node, and the second node to a first logical level;
pulling one of the first data line and the second data line, and a corresponding one of the first node and the second node, toward a second logic level different from the first logic level;
activating the sense amplifier; and
prior to the activating the sense amplifier, driving a first circuit to maintain the other one of the first node and second node at the first logic value responsive to a voltage level of the one of the first data line and the second data line, wherein
the pulling one of the first data line and the second data line is initiated while the first pass gate and the second pass gate remain turned on.

16. The method of claim 15, further comprising:
driving a second circuit to pull one of the first node and the second node toward the second logic value responsive to a voltage level of the other one of the first data line and the second data line, the second circuit being outside a cross latch of the sense amplifier.

17. The method of claim 15, wherein
pulling one of the first data line and the second data line, and a corresponding one of the first node and the second node, toward a second logic level is responsive to data stored in a memory cell.

18. A sense amplifier comprising:
a cross latch having a first input/output (I/O) node and a second I/O node;
a first pass gate coupled between a first data line and the first I/O node;
a second pass gate coupled between a second data line and the second I/O node;
a first circuit coupled with the first I/O node and the second data line, and configured to be turned off when the second data line has a first logical value and to be at least lightly turned on by a transition of a voltage level on the second data line between the first logical value and a second logical value different from the first logical value;
a second circuit coupled with the second I/O node and the first data line, and configured to be turned off when the first data line has the first logical value and to be at least lightly turned on by a transition of a voltage level on the first data line between the first logical value and the second logical value; and
a third circuit coupled with the cross latch, the first data line, and the second data line, wherein
the first pass gate is configured to be in a closed state during a pre-charge phase of the sense amplifier.

19. The sense amplifier of claim 18, wherein
the first circuit, the second circuit, the first pass gate, and the second pass gate each include a P-type transistor; and
the third circuit includes a first N-type transistor and a second N-type transistor.

20. The sense amplifier of claim 19, further comprising a third N-type transistor configured to turn on or turn off the sense amplifier,
wherein
drains of the first N-type transistor and the second N-type transistor are coupled with the cross-latch; and
sources of the first N-type transistor and the second N-type transistor are coupled with a drain of the third N-type transistor.

* * * * *